United States Patent
Lavoie et al.

(10) Patent No.: US 12,099,899 B2
(45) Date of Patent: Sep. 24, 2024

(54) INCREASING GRAIN SIZE OF POLYCRYSTALLINE SUPERCONDUCTING MATERIALS FOR SUPERCONDUCTING CIRCUITS

(71) Applicant: INTERNATIONAL BUSINESS MACHINES CORPORATION, Armonk, NY (US)

(72) Inventors: Christian Lavoie, Pleasantville, NY (US); Benjamin Wymore, Cortlandt Manor, NY (US); Markus Brink, White Plains, NY (US); Sweet Jean L., Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1101 days.

(21) Appl. No.: 16/945,571

(22) Filed: Jul. 31, 2020

(65) Prior Publication Data

US 2022/0036228 A1 Feb. 3, 2022

(51) Int. Cl.
*G06N 5/04* (2023.01)
*G06N 10/00* (2022.01)
*H03K 17/92* (2006.01)
*H03K 19/195* (2006.01)

(52) U.S. Cl.
CPC ............ *G06N 10/00* (2019.01); *H03K 17/92* (2013.01); *H03K 19/195* (2013.01)

(58) Field of Classification Search
CPC ...................................................... G06N 10/00
See application file for complete search history.

(56) References Cited

U.S. PATENT DOCUMENTS

| | | | |
|---|---|---|---|
| 8,221,909 B2 | 7/2012 | Aytug et al. | |
| 8,278,200 B2 | 10/2012 | Lavoie et al. | |
| 8,981,211 B2 | 3/2015 | Girt et al. | |
| 9,236,345 B2 | 1/2016 | Alptekin et al. | |
| 2020/0287119 A1* | 9/2020 | Black | H10N 60/85 |

OTHER PUBLICATIONS

Siegal et al. "Formation of epitaxial yttrium silicide on (111) silicon." J. Appl. Phys. 66(7), Oct. 1, 1989. (Year: 1989).*
Tung et al. "Formation of Ultrathin Single-Crystal Silicide Films on Si: Surface and Interfacial Stabilization of Si—NiSi2 Epitaxial Structures." Phys. Rev. Lett. 50, 429 (1983). (Year: 1983).*

(Continued)

*Primary Examiner* — Paul A Wartalowicz
(74) *Attorney, Agent, or Firm* — Amin, Turocy & Watson, LLP

(57) ABSTRACT

A method of increasing grain size of polycrystalline superconducting materials for superconducting circuits, includes forming an initial superconducting epitaxial layer lattice matched to a substrate formed of a substrate material, the initial superconducting epitaxial layer formed of a compound including the substrate material and a first metal; and forming a second layer of the first metal on the initial superconducting epitaxial layer and heating the layers to increase a thickness of the initial superconducting epitaxial layer formed of the compound.

25 Claims, 7 Drawing Sheets

(56) References Cited

OTHER PUBLICATIONS

Cemin, F., et al.,, "Epitaxial growth of Cu (001) thin films onto Si (001) using a single-step HiPIMS process", . Scientific reports, 7(1), 1655.
Muydinov et al., "Crystallisation Phenomena of In2O3: H Films", Materials 2019, 12, 266.
Chiu et al., "Ultralow 1/f noise in a heterostructure of superconducting epitaxial cobalt disilicide thin film on silicon", ACS nano, 11(1), 516-525.
Gerstl, M., "The separation of grain and grain boundary impedance in thin yttria stabilized zirconia (YSZ) layers" Solid State Ionics, 185 (2011), 32-41.
Cho, J. H., "Growth of monolayer graphene on nanoscale copper-nickel alloy thin films", Carbon NY, May 2017; 115, pp. 441-448.
Holmvall, P. et al., "Broken translational symmetry at edges of high-temperature superconductors" Nature communications, (2018), 9, 2190.
Zhang et al., "Exploitation of a self-limiting process for reproducible formation of ultrathin Ni1—xPtxNi1—xPtx silicide films", Appl. Phys. Lett. 97, 252108 (2010).

\* cited by examiner

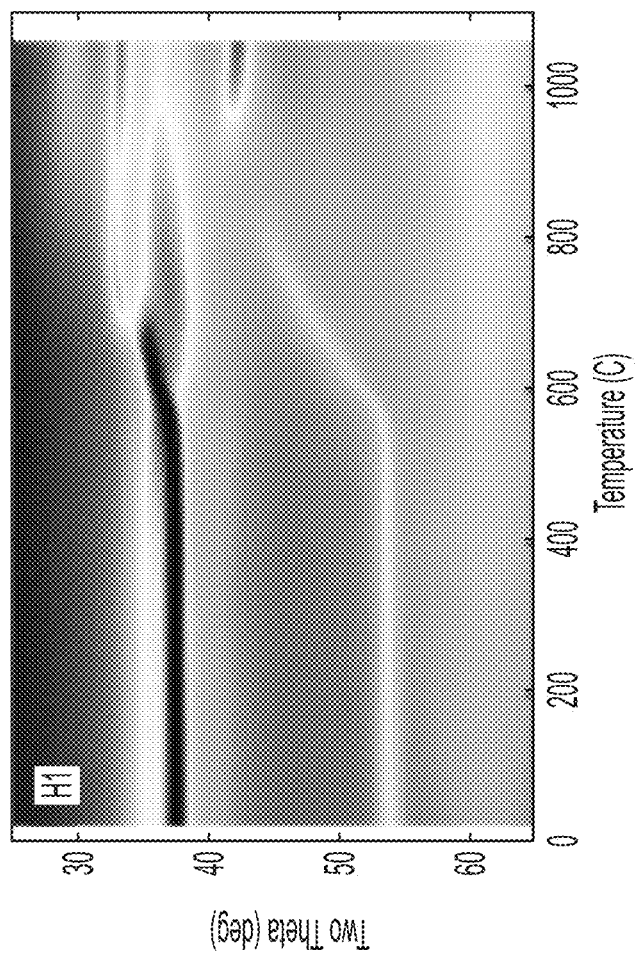

INCREASING GRAIN SIZE OF POLYCRYSTALLINE SUPERCONDUCTING MATERIALS FOR SUPERCONDUCTING CIRCUITS

BACKGROUND

The currently claimed embodiments of the present invention relate to a method and corresponding circuit for controlling superconducting material grain size for superconducting circuits.

Quantum circuits have a number of applications. For example, quantum computing circuits may have quantum circuits with qubits, and waveguide circuits. The waveguide circuits are configured to provide electromagnetic radiation to the qubits.

As Q factors of the waveguides in superconducting quantum circuits reach above $1 \times 10^6$, materials defects or non-uniformities are affecting the quality factors of waveguides. The microstructure, through various processing, leads to roughness at surfaces of superconducting metal which increases losses that, in turn, decrease the quality factors of waveguides and qubits. Microstructure of the superconducting materials in use today for quantum circuits, is of the order of the size of the Cooper pairs. Grain boundaries and roughness may affect microwave losses in these microstructures. This would lead to small losses that become relevant when quality factors become high.

SUMMARY

An aspect of the present invention is to provide a quantum circuit including a waveguide circuit arranged to provide electromagnetic radiation to a qubit. At least one of the qubit and the waveguide circuit is formed to have elements including a superconducting epitaxial layer lattice matched to a substrate formed of a substrate material, the superconducting epitaxial layer formed of a compound including the substrate material and a first material.

Another aspect of the present invention is to provide a method of increasing grain size of polycrystalline superconducting materials for superconducting circuits. The method includes forming an initial superconducting epitaxial layer lattice matched to a substrate formed of a substrate material, the initial superconducting epitaxial layer formed of a compound including the substrate material and a first metal. The method further includes forming a second layer of the first metal on the initial superconducting epitaxial layer and heating the layers to increase a thickness of the initial superconducting epitaxial layer formed of the compound.

In an embodiment, the substrate material comprises a semiconductor material. In an embodiment, the semiconductor material includes at least one of silicon, germanium, or combinations of silicon and germanium, sapphire, diamond, or any combination thereof. In an embodiment, the initial superconducting epitaxial layer comprises a silicide or a germanide. In an embodiment, the silicide comprises cobalt silicide.

In an embodiment, forming the second layer of the first metal includes depositing the second layer on the initial superconducting epitaxial layer. In an embodiment, heating the layers to increase a thickness of the initial superconducting epitaxial layer is performed after depositing the second layer of the first metal. In an embodiment, heating the layers to increase a thickness of the initial superconducting epitaxial layer is performed while depositing the second layer of the first metal. In an embodiment, forming the superconducting layer includes forming the superconducting layer using physical vapor deposition or chemical vapor deposition.

A further aspect of the present invention is to provide a method of increasing grain size of polycrystalline superconducting materials for superconducting circuits. The method includes forming a diffusion enhancer layer, including a first superconducting metal, on a substrate. The method further includes depositing a second superconducting material on the diffusion enhancer layer at a deposition temperature in a temperature range including the melting temperature of the diffusion enhancer layer such that diffusion of the second superconducting material is enhanced within the diffusion enhancer layer, and a grain size of the second superconducting material is increased.

In an embodiment, the deposition temperature of the second superconducting metal is such that a distance between nucleation sites for nucleation of the second superconducting material is increased. In an embodiment, the diffusion enhancer layer includes at least one of Al, In or Sn. In an embodiment, the second superconducting material comprises Nb. In an embodiment, the diffusion enhancer layer is thinner than the second superconducting material. In an embodiment, the temperature range of the deposition of the second superconducting material includes temperatures above or below the melting point of the diffusion enhancer layer. In an embodiment, the temperature range of the deposition temperature is between 100° C. and 250° C.

Another aspect of the present invention is to provide a method of increasing grain size of polycrystalline superconducting materials for superconducting circuits. The method includes setting a grain structure of superconducting elements in a quantum circuit using a separation of phase of elements in the superconducting elements which are fully miscible at higher temperatures and not miscible at lower temperatures.

In an embodiment, a microstructure of phase separated elements is controlled by a rate of cooling. In an embodiment, the superconducting elements in the quantum circuit include Nb—Zr alloys.

Another aspect of the present invention is to provide a method of increasing grain size of polycrystalline superconducting materials for superconducting circuits. The method includes heating a mixture, the mixture including a first superconducting material and a second material that does not form intermetallic and are not miscible at room temperature, to a first temperature where the first superconducting material and the second material become miscible. The method further includes cooling the mixture to a second temperature where the first superconducting material and the second material are not miscible any longer. The cooling is performed such that two materials phase separate into their respective crystal structures.

In an embodiment, the mixture has a Nb—Zr alloy. In an embodiment, the method further includes forming a diffusion barrier on a substrate; and forming the mixture on the diffusion barrier. In an embodiment, the substrate includes a material selected from the group consisting of silicon, germanium, sapphire, and diamond.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

FIG. 10 illustrates two theta XRD results as a function of temperature for a $Nb_{0.8}Zr_{0.2}$ co-sputtered alloy according to some embodiments.

DETAILED DESCRIPTION

To address the surface roughness of waveguides, it is proposed to increase the grain size of superconducting materials of the waveguides. Specifically, three general ways of increasing the grain size are provided herein.

First, epitaxial waveguide structures are proposed, which provide a large grain size. A superconducting epitaxial layer is formed of a compound including the substrate material and a first metal deposited on the substrate material. As one example, some superconducting silicides, such as $CoSi_2$, can be epitaxial with Si. Both cubic structure of the $CoSi_2$ and the Si may practically have the same dimensions.

Second, a diffusion enhancer film is proposed to increase the grain size of the waveguide material. As one example, a niobium film may be sputtered at high temperature into layers which allow for increased surface diffusion, such as In, Sn, or Al. The sputtering may be performed, for example, into In or Sn below or above the melting point of In or Sn. As in the epitaxy technique, Sn or In is also expected to smooth the waveguide superconducting material film surface.

Third, the waveguides may be formed using two materials to adjust the grain sizes using controlled phase separation during cooling. In an embodiment, the two materials need to be highly soluble or fully miscible at high temperature and show little solubility at room temperature. This phase separation upon cooling allows for measurement of the effect of microstructure grain size on the quality factors. As one example, mixtures of niobium (Nb) and zirconium (Zr) may be used, where niobium and zirconium are the two materials. Another example could be a mixture of aluminum (Al) and zinc (Zn) with Zn concentrations ranging from about 20 to about 60 atomic %.

Figure 1:
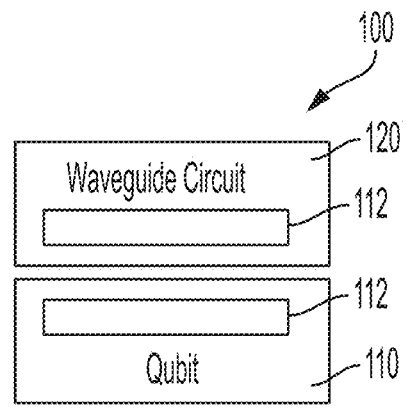
FIG. 1 is a quantum circuit, according to some embodiments.

Epitaxial waveguide: FIG. 1 is a schematic of a quantum circuit 100 including at least one qubit 110, and a waveguide circuit 120. The waveguide circuit 120 is arranged to provide electromagnetic radiation to the at least one qubit 110. The at least one qubit 110 and the waveguide circuit 120 may have superconducting elements 112.

Figure 2:
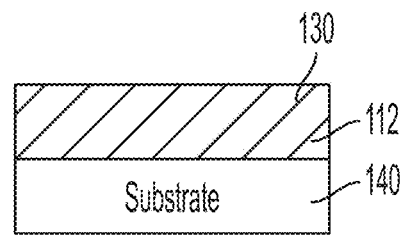
FIG. 2 illustrates at least one of the qubit, or the waveguide circuit, formed to have superconducting elements including a superconducting epitaxial layer lattice matched to a substrate, according to some embodiments.

FIG. 2 illustrates at least one of the qubit 110 (or the waveguide circuit 120) is formed to have superconducting elements 112 including a superconducting epitaxial layer 130 lattice matched to a substrate 140 formed of a substrate material. The superconducting epitaxial layer 130 may be formed of a compound including the substrate material and a first metal.

Figure 3A:
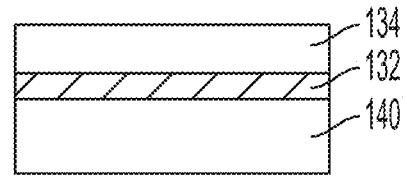
FIGS. 3A and 3B illustrate a structure for showing a method of forming a superconducting epitaxial layer, according to some embodiments.
Figure 3B:
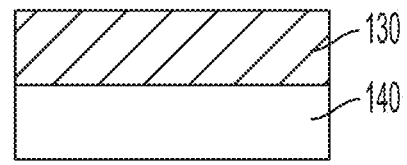

The quantum circuit 110 may be formed by a method of increasing grain size of polycrystalline superconducting metals for superconducting circuits, where the method according to some embodiments is illustrated in FIG. 3A and FIG. 3B. An initial superconducting epitaxial layer 132 is formed lattice matched to the substrate 140. The substrate 140 is formed of a substrate material. The substrate material may be a semiconductor material, for example, such as Si or Ge, or combinations of Si and Ge, for example. The initial superconducting epitaxial layer 132 may be formed of a compound including the substrate material and a first metal. The first metal of the initial superconducting epitaxial layer 132, may be one of Co, V, Pt or Nb, for example. In an embodiment, the initial superconducting epitaxial layer 132 may be a silicide, for example, such as $CoSi_2$.

A layer 134 of the first metal is formed on the initial superconducting epitaxial layer 132. The layer 134 of the first metal may be formed on the initial superconducting epitaxial layer 132 by deposition, for example, layer 134 of the first metal may be formed by sputtering or chemical vapor deposition, for example. Prior to forming the layer 134, surface oxide may be removed from the initial superconducting epitaxial layer 132.

The formed layer 134 is then heated to increase a thickness of the initial superconducting epitaxial layer 132 formed of the compound. The superconducting epitaxial layer 130 thus may be formed by the heating to increase the thickness of the initial superconducting epitaxial layer 132. The heating the layer 134 to increase a thickness of the initial superconducting epitaxial layer 132 may be performed after the superconducting layer 134 is deposited. Alternatively, the heating of the layer 134 to increase a thickness of the initial superconducting epitaxial layer 132 may be performed while the layer 134 is deposited.

According to some embodiments the substrate 140 may be Si, the initial superconducting epitaxial layer 132 may be $CoSi_2$, and the first metal may be Co. An initial thin layer of Co (for example, a thickness<5 nm) is deposited on the Si substrate 140 having a (100) or (111) orientation, and heated to form the initial superconducting epitaxial layer 132 of $CoSi_2$. $CoSi_2$ is a superconducting material. Unreacted Co is etched away.

The layer 134 of Co is deposited at a ratio of the desired waveguide thickness of about 1/3.6. For example, 55 nm of Co is deposited for a 200 nm $CoSi_2$ film. A slow anneal is performed using the $CoSi_2$ film 132 (and possible surface oxide) as a template to perform barrier mediated epitaxy. During the anneal, Co passes through the $CoSi_2$ film 132 and reacts with the underlying Si substrate thereby increasing the thickness of the superconducting epitaxial layer 132 of $CoSi_2$.

Figure 4:
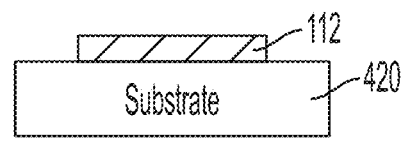
FIG. 4 illustrates a structure, according to some embodiments formed to have superconducting elements on a substrate formed using a diffusion enhancer layer.

Diffusion enhancer layer: FIG. 4 illustrates how at least one of the qubit 110 (or the waveguide circuit 120) (see FIG. 1) is formed of superconducting elements 112 on a substrate 420. The superconducting elements 112 are formed using a diffusion enhancer layer, wherein the elements 112 have a grain size greater than one micron.

Figure 5:
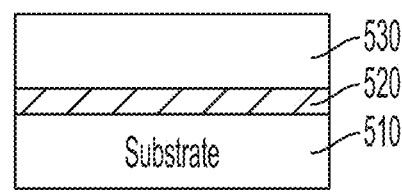
FIG. 5 illustrates a structure for showing a method using a diffusion enhancer layer, according to some embodiments.

According to some embodiments, a method of increasing grain sizes using a diffusion enhancer layer is described with respect to FIG. 5. A diffusion enhancer layer 520, comprising a first superconducting metal, is formed on a substrate 510. The diffusion enhancer layer 520 may comprise at least one of Al, In or Sn. A second superconducting metal 530 is deposited on the diffusion enhancer layer 520 at a deposition temperature in a temperature range including the melting temperature of the diffusion enhancer layer 520 such that diffusion of the second superconducting metal 530 is enhanced within the diffusion enhancer layer 520, and the grain size of the second superconducting metal 530 is increased. The second superconducting metal 530 may comprise niobium (Nb), for example. In an embodiment, the diffusion enhancer layer 520 may be thinner than the second superconducting metal 530.

The grain size of the second superconducting metal 530 may be increased by the deposition temperature being such that the distance between nucleation sites for nucleation of the second superconducting metal 530 is increased. The diffusion length of Nb is increased at the surface and distance is increased between nuclei upon deposition of the second superconducting metal 530.

The deposition temperature may be such that the surface roughness of the second superconducting metal 530 is decreased. The temperature range may include temperatures above and below the melting point of the diffusion enhancer layer 520.

An example of using a diffusion enhancer layer 520 follows. A thin superconducting metal of In of about 2-10 nm is deposited as the diffusion enhancer layer 520. Nb is sputtered as the second superconducting metal 530 on the In layer (diffusion enhancer layer 520) at various temperature below and above the melting points of the low melting point metals (In): 100° C., 150° C., 200° C., and 250° C. Based on X-ray diffraction (XRD) data of the In and Nb structure, inter-metallics of In and Nb do not form at the various temperatures of 100° C., 150° C., 200° C., and 250° C. No changes in the Nb XRD peak is observed below 300° C. confirming the lack of intermetallic formation at these low temperatures. As a result, Nb diffusion from the second superconducting metal 530 is greatly enhanced through the liquid diffusion enhancer layer 520, the distance between nucleation centers increases, resulting in an increase in grain size of Nb. As a result, surfaces of the Nb second superconducting metal 530 becomes much smoother.

Controlled phase separation: Referring to the quantum circuit of FIG. 1, at least one of the qubit 110 and the waveguide circuit 120 may be formed to have superconducting elements 112 which have a grain structure set using separation of phase of materials which are highly soluble or fully miscible at higher temperatures and not significantly soluble at lower temperatures.

According to some embodiments, a method is described using controlled phase separation which comprises setting a grain structure of quantum circuit superconducting elements using separation of phase of the elements which are highly soluble or fully miscible at higher temperatures and not significantly soluble at lower temperatures. The quantum circuit superconducting elements may comprise NbZr alloys, for example. They could also comprise AlZn alloys.

Figure 6A:
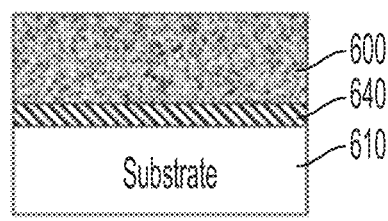
FIGS. 6A and 6B illustrate a structure for showing a method using controlled phase separation, according to some embodiments.
Figure 6B:
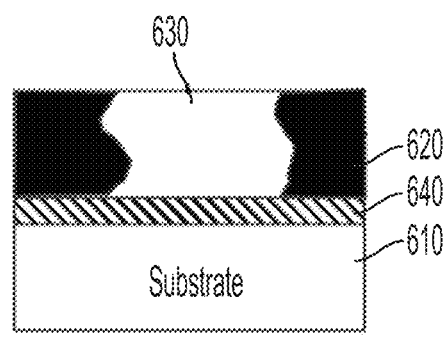

According to some embodiments, a method using controlled phase separation is described with respect to FIGS. 6A and 6B. The method includes heating a mixture 600, including a first superconducting material 620 and a second superconducting material 630, to a first temperature where the first superconducting material 620 and the second superconducting material 630 are soluble. The mixture 600 is then cooled to a second temperature where the first superconducting material 620 and the second superconducting material 630 are not miscible and do not form inter-metallics, wherein the cooling is performed such that the first and second material separate and are not anymore part of a uniform mixture, as shown in FIG. 6B. The grain size of the resulting film depends on the cooling rate and is greater for a lower cooling rate.

A diffusion barrier 640 may be formed on a substrate 610, and the mixture formed on the diffusion barrier 640 according to some embodiments. For a substrate of Si, the diffusion barrier 640 may be, for example, TaN or WN. The mixture 600 may comprise a Nb—Zr alloy, for example. The substrate 610 may comprises at least one of silicon, germanium or combinations of silicon or germanium, for example. The substrate 610 can also include sapphire and/or diamond.

Figure 7:
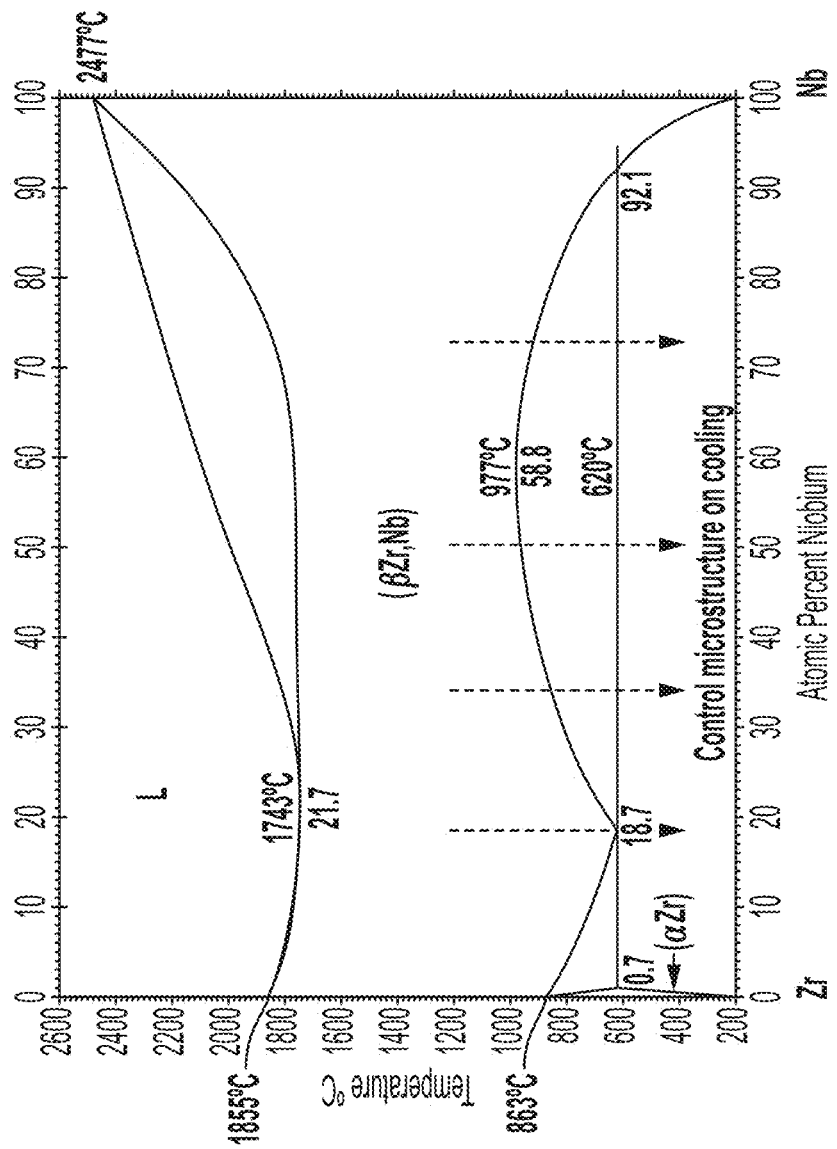
FIG. 7 illustrates a phase diagram for Nb—Zr.

An example of controlled phase separation using a Nb—Zr alloy is described with respect to FIG. 7, which illustrates a phase diagram for Nb—Zr. Generally, for Nb—Zr at low temperatures, α-Zr exhibits a hexagonal closed packed (HCP) structure with little solubility for Nb, and Nb has a body-centered cubic (BCC) structure with little solubility for α-Zr. Further at low temperatures Zr and Nb do not form inter-metallics.

When Zr transforms to the β phase BCC at 620° C., the two crystal structures of Zr and Nb become soluble and fully miscible above 977° C. Therefore, a high temperature anneal can fully mix a Nb—Zr film. Slow cooling through 620° C. will transform and expel Zr from the BCC structure. The rate of cooling will control the microstructure including the grain size.

Figure 8:
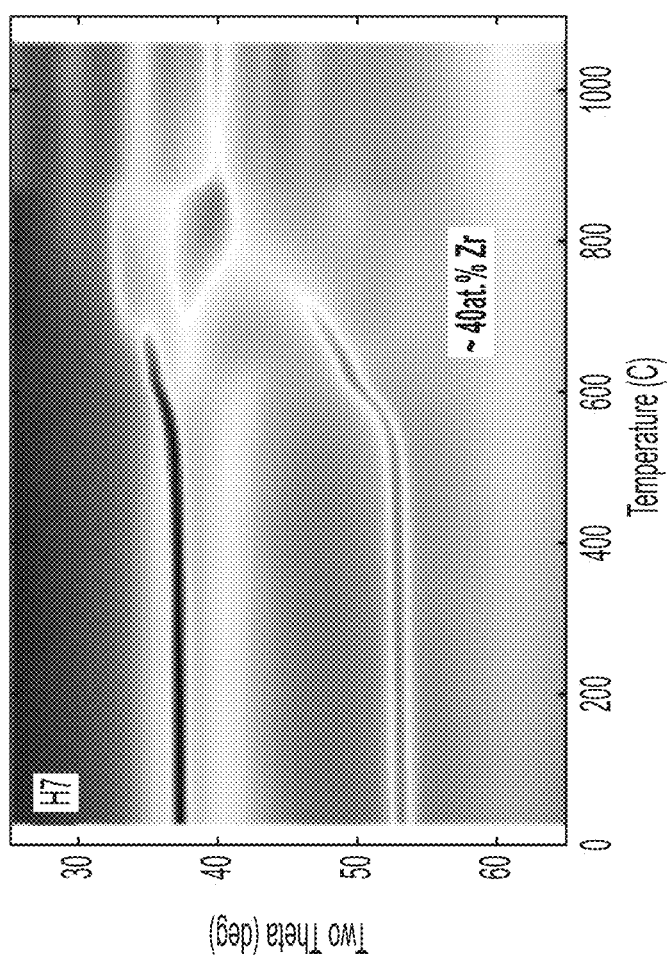
FIG. 8 illustrates two theta XRD results as a function of temperature for a $Nb_{0.6}Zr_{0.4}$ co-sputtered alloy.

FIG. 8 illustrates two theta X-Ray Diffraction (XRD) results as a function of temperature for a $Nb_{0.6}Zr_{0.4}$ co-sputtered alloy. Two strong peaks are observed for the alloy at room temperature consistent with expected BCC structured metals, where the peaks are in between position for BCC Nb and BCC Zr. As more Zr incorporates above 550° C., the two theta XRD peaks shift to lower angles. Cooling from 650° C. will force Zr out of the BCC structure. Varying the cooling rate varies the size of grains in the material.

Figure 9:
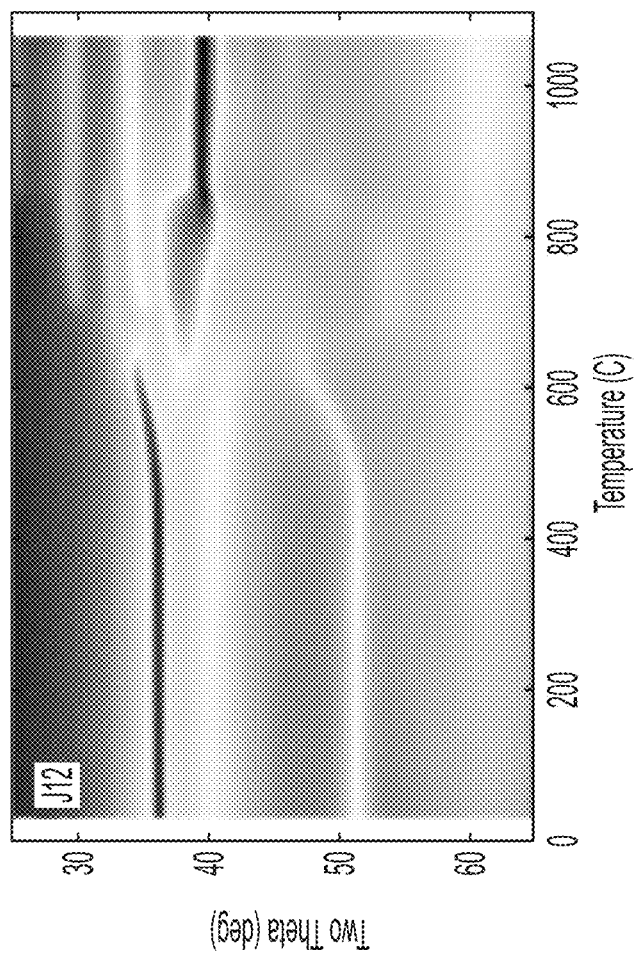
FIG. 9 illustrates two theta XRD results as a function of temperature for a $Nb_{0.4}Zr_{0.6}$ co-sputtered alloy according to some embodiments.

FIGS. 9 and 10 illustrate two theta XRD results as a function of temperature for a $Nb_{0.4}Zr_{0.6}$ co-sputtered alloy, and a $Nb_{0.8}Zr_{0.2}$ co-sputtered alloy, respectively. Therefore, FIGS. 8-10 illustrate Nb co-sputtered alloy with variations in the Zr concentration. Two intense BCC peaks (peaks around 36-38 degrees and around 51-53 degrees) move to a lower two theta angle at room temperature as Zr increased in the co-sputtered mixture. An amorphous like peak also at room temperature, at 40-41 degrees is more intense with increased Zr concentration. Shifts in BCC peaks to lower angle with increasing temperature is consistent with disappearance of peaks associated with the presence of Zr confirming that Zr is dissolved into the BCC structure. Alloys are deposited on a TaN barrier on Si(100). Peaks above 900° C. are linked with diffusion barrier breakdown and formation of Nb—Zr silicides. The data confirms incorporation of Zr into the BCC Nb structure with increasing temperature. The cooling rate can control the segregation and resulting microstructure of the final film.

According to some embodiments, the co-sputtered film may be annealed and held at 650° C. The co-sputtered film may then be cooled to ~500° C. rapidly (seconds), intermediately (minutes), or slowly (hours), depending on the grain size desired.

The descriptions of the various embodiments have been presented for the purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method, comprising:
    forming an initial superconducting epitaxial layer that is lattice matched to a substrate formed of a substrate material, the initial superconducting epitaxial layer formed of a compound including the substrate material and a first metal, wherein the forming the initial superconducting epitaxial layer comprises:
        depositing a first layer of the first metal on the substrate material of the substrate,
        heating the first layer of the first metal, and
        etching away one or more portions of the first metal that did not react, from the heating, with the substrate material to form the compound;
    forming a second layer of the first metal on the initial superconducting epitaxial layer; and
    heating the second layer of the first metal to a temperature the causes portions of the first metal to pass through the initial superconducting epitaxial layer and react with the substrate material of the substrate to increase a thickness of the initial superconducting epitaxial layer formed of the compound.

2. The method of claim 1, wherein the substrate material comprises a semiconductor material.

3. The method of claim 2, wherein the semiconductor material comprises at least one of silicon, germanium, or combinations of silicon and germanium.

4. The method of claim 1, wherein the initial superconducting epitaxial layer comprises a silicide or a germanide.

5. The method of claim 4, wherein the silicide comprises cobalt silicide.

6. The method of claim 1, wherein the forming the second layer of the first metal comprises depositing the second layer on the initial superconducting epitaxial layer.

7. The method of claim 6, wherein the heating the second layer is performed after depositing the second layer of the first metal.

8. The method of claim 6, wherein the heating the second layer is performed while depositing the second layer of the first metal.

9. The method of claim 1, wherein forming the initial superconducting epitaxial layer comprises forming the initial superconducting epitaxial layer using physical vapor deposition or chemical vapor deposition.

10. A method, comprising:
    forming a waveguide circuit, wherein the forming comprises:
        forming an initial superconducting epitaxial layer of the waveguide circuit that is lattice matched to a substrate formed of a substrate material of the waveguide circuit, the initial superconducting epitaxial layer formed of a compound including the substrate material and a first metal, wherein the forming the initial superconducting epitaxial layer of the waveguide circuit comprises:
            depositing a first layer of the first metal on the substrate material of the substrate of the waveguide circuit,
            heating the first layer of the first metal, and
            etching away one or more portions of the first metal that did not react, from the heating, with the substrate material to form the compound;
        forming a second layer of the first metal on the initial superconducting epitaxial layer of the waveguide circuit; and
        heating the second layer of the first metal to a temperature the causes portions of the first metal to pass through the initial superconducting epitaxial layer and react with the substrate material of the substrate to increase a thickness of the initial superconducting epitaxial layer formed of the compound.

11. The method of claim 10, wherein:
    the substrate material comprises a semiconductor material comprising at least one of silicon or germanium; and
    the initial superconducting epitaxial layer comprises a silicide or a germanide.

12. The method of claim 10, wherein the forming the second layer of the first metal comprises depositing the second layer on the initial superconducting epitaxial layer of the waveguide circuit.

13. The method of claim 10, wherein the heating the second layer is performed after depositing the second layer of the first metal or while depositing the second layer of the first metal.

14. A method, comprising:
    forming a qubit, wherein the forming comprises:
        forming an initial superconducting epitaxial layer of the qubit that is lattice matched to a substrate formed of a substrate material of the qubit, the initial superconducting epitaxial layer formed of a compound including the substrate material and a first metal, wherein the forming the initial superconducting epitaxial layer comprises:
            depositing a first layer of the first metal on the substrate material of the substrate of the qubit,
            heating the first layer of the first metal, and
            etching away one or more portions of the first metal that did not react, from the heating, with the substrate material to form the compound;
        forming a second layer of the first metal on the initial superconducting epitaxial layer of the qubit; and
        heating the second layer of the first metal to a temperature the causes portions of the first metal to pass through the initial superconducting epitaxial layer and react with the substrate material of the substrate to increase a thickness of the initial superconducting epitaxial layer formed of the compound.

15. The method of claim 14, wherein:
    the substrate material comprises a semiconductor material comprising at least one of silicon or germanium; and
    the initial superconducting epitaxial layer comprises a silicide or a germanide.

16. The method of claim 14, wherein the forming the second layer of the first metal comprises depositing the second layer on the initial superconducting epitaxial layer of the qubit.

17. The method of claim 14, wherein the heating the second layer is performed after depositing the second layer of the first metal or while depositing the second layer of the first metal.

18. A method, comprising:
forming a quantum circuit, wherein the forming comprises:
forming an initial superconducting epitaxial layer of the quantum circuit that is lattice matched to a substrate formed of a substrate material of the quantum circuit, the initial superconducting epitaxial layer formed of a compound including the substrate material and a first metal, wherein the forming the initial superconducting epitaxial layer comprises:
depositing a first layer of the first metal on the substrate material of the substrate of the quantum circuit,
heating the first layer of the first metal, and
etching away one or more portions of the first metal that did not react,
from the heating, with the substrate material to form the compound;
forming a second layer of the first metal on the initial superconducting epitaxial layer of the quantum circuit; and
heating the second layer of the first metal to a temperature the causes portions of the first metal to pass through the initial superconducting epitaxial layer and react with the substrate material of the substrate to increase a thickness of the initial superconducting epitaxial layer formed of the compound.

19. The method of claim 18, wherein:
the substrate material comprises a semiconductor material comprising at least one of silicon or germanium; and
the initial superconducting epitaxial layer comprises a silicide or a germanide.

20. The method of claim 18, wherein the forming the second layer of the first metal comprises depositing the second layer on the initial superconducting epitaxial layer of the quantum circuit.

21. The method of claim 18, wherein the heating the second layer is performed after depositing the second layer of the first metal or while depositing the second layer of the first metal.

22. A method, comprising:
forming a superconducting circuit, wherein the forming comprises:
forming an initial superconducting epitaxial layer of the superconducting circuit that lattice matched to a substrate formed of a substrate material of the superconducting circuit, the initial superconducting epitaxial layer formed of a compound including the substrate material and a first metal, wherein the forming the initial superconducting epitaxial layer comprises:
depositing a first layer of the first metal on the substrate material of the substrate of the superconducting circuit,
heating the first layer of the first metal, and
etching away one or more portions of the first metal that did not react,
from the heating, with the substrate material to form the compound;
forming a second layer of the first metal on the initial superconducting epitaxial layer of the superconducting circuit; and
heating the second layer of the first metal to a temperature the causes portions of the first metal to pass through the initial superconducting epitaxial layer and react with the substrate material of the substrate to increase a thickness of the initial superconducting epitaxial layer formed of the compound.

23. The method of claim 22, wherein:
the substrate material comprises a semiconductor material comprising at least one of silicon or germanium; and
the initial superconducting epitaxial layer comprises a silicide or a germanide.

24. The method of claim 22, wherein the forming the second layer of the first metal comprises depositing the second layer on the initial superconducting epitaxial layer of the superconducting circuit.

25. The method of claim 22, wherein the heating the second layer is performed after depositing the second layer of the first metal or while depositing the second layer of the first metal.

* * * * *